(12) United States Patent
Tenkou

(10) Patent No.: US 6,562,685 B1
(45) Date of Patent: May 13, 2003

(54) METHOD OF FABRICATING FIELD EFFECT TRANSISTOR

(75) Inventor: Li Tenkou, Kanagawa (JP)

(73) Assignee: Oki Electric Industry CO, Ltd., Tokyo (JP)

( * ) Notice: Subject to any disclaimer, the term of this patent is extended or adjusted under 35 U.S.C. 154(b) by 0 days.

(21) Appl. No.: 09/688,036

(22) Filed: Oct. 12, 2000

(30) Foreign Application Priority Data

Oct. 13, 1999 (JP) .......................................... 11-291176

(51) Int. Cl.[7] ..................... H01L 21/336; H01L 21/4763
(52) U.S. Cl. ..................... 438/299; 438/682; 438/302; 438/683; 438/664; 438/592
(58) Field of Search ................................ 438/299, 682, 438/592, 655, 649, 663–664, 302, 301, 525, 683

(56) References Cited

U.S. PATENT DOCUMENTS

| | | | | |
|---|---|---|---|---|
| 5,190,887 A | * | 3/1993 | Tang et al. ................. | 438/264 |
| 5,227,320 A | * | 7/1993 | Johnson et al. ............ | 438/304 |
| 5,355,006 A | * | 10/1994 | Iguchi ........................ | 257/296 |
| 5,413,945 A | * | 5/1995 | Chien et al. ................ | 438/217 |
| 5,439,835 A | * | 8/1995 | Gonzalez ................... | 438/241 |
| 5,565,383 A | * | 10/1996 | Sakai ......................... | 204/192.17 |
| 5,599,741 A | * | 2/1997 | Matsumoto et al. ........ | 438/304 |
| 5,631,485 A | * | 5/1997 | Wei et al. ................... | 257/344 |
| 5,883,412 A | * | 3/1999 | Ferla et al. ................. | 257/341 |
| 5,891,774 A | * | 4/1999 | Ueda et al. ................. | 438/264 |
| 5,902,129 A | * | 5/1999 | Yoshikawa et al. ........ | 438/592 |
| 6,037,233 A | * | 3/2000 | Liu et al. .................... | 438/304 |
| 6,078,081 A | * | 6/2000 | Lee ............................ | 257/344 |
| 6,171,959 B1 | * | 1/2001 | Nagabushnam ............ | 438/683 |
| 6,268,241 B1 | * | 7/2001 | Chen et al. ................. | 438/230 |

* cited by examiner

*Primary Examiner*—Tuan H. Nguyen
*Assistant Examiner*—Thanh Nguyen
(74) *Attorney, Agent, or Firm*—Rabin & Berso, P.C.

(57) ABSTRACT

There is provided a method of fabricating a MOSFET having a source region and a drain region, having a LDD region, respectively, in respective regions directly beneath the edges of the gate electrode even without forming the sidewalls of the gate electrode. A silicide layer 18 is formed on the surface of a polysilicon layer 16 through selective growth of material used for a gate silicide {FIG. 1(A)}, and thereby a gate electrode made up of the polysilicon layer 16 and the silicide layer 18 is formed. Subsequently, a first implantation of ions in low concentration is performed whereby arsenic ions As$^+$ or phosphorus ions P$^+$, in low concentration, are implanted into the surface of a silicon substrate 10 from a direction at a slant to the surface thereof such that a dopant is implanted into respective regions directly beneath the edges of the polysilicon layer 16, within a region set to form a source and a drain, respectively, on respective sides of the gate electrode {FIG. 1(B)}. A second implantation of ions in high concentration is performed whereby arsenic ions As$^+$, in high concentration, are implanted into a source region 20*a* and a drain region 22*a*, in shallow junction state, formed on respective sides of the gate electrode, from the direction vertical to the surface of the silicon substrate 10 {FIG. 1(C)}.

13 Claims, 3 Drawing Sheets

IMPLANTATION OF As$^+$ (OR P$^+$) ION IN LOW CONCENTRATION INTO Si SUBSTRATE

IMPLANTATION OF As$^+$ ION IN HIGH CONCENTRATION INTO Si SUBSTRATE

IMPLANTATION OF As+ (OR P+) ION IN LOW
CONCENTRATION INTO Si SUBSTRATE

IMPLANTATION OF As+ ION IN HIGH
CONCENTRATION INTO Si SUBSTRATE

METHOD OF FABRICATING FIELD EFFECT TRANSISTOR

BACKGROUND OF THE INVENTION

1. Field of the Invention

The present invention relates to a method of fabricating a field effect transistor (referred to hereinafter as a MOSFET), and in particular, to a method of fabricating a MOSFET having a source region as well as a drain region of a LDD (light doped drain) structure.

2. Description of the Related Art

In order to maintain pressure resistance without deteriorating device performance, it has been in practice to form the source region and the drain region into the LDD (light doped drain) structure. The LDD structure is a structure having a lightly doped region in comparison with the source region and the drain region, in a region directly beneath the gate electrode, within the source region and the drain region, respectively, and can be formed by implanting ions in two stages when forming the source region and the drain region.

For example, as shown in FIG. 3, by implanting a dopant such as arsenic ions $As^+$ or phosphorus ions $P^+$, in low concentration, into the surface of a silicon substrate 30 on which there are formed device separation regions 32, a gate oxide film 34, and a gate electrode made up of a polysilicon layer 36 and a gate silicide layer 38 of tungsten silicide or so forth, deposited in layers on the gate oxide film 34, in the direction vertical to the surface of the silicon substrate 30, self-aligning ion implantation by the agency of the gate electrode is performed {refer to FIG. 3(A)}.

That is, as a result of implantation of ions in low concentration, a source region 40a and a drain region 42a, which are in shallow junction state, are formed.

Thereafter, a $SiO_2$ film 44 is formed on the entire surface {refer to FIG. 3(B)}, and by etch-backing, that is, by etching the entire surface of the $SiO_2$ film 44 and completing the etching when the top face of the gate electrode is exposed, a sidewall 46 made of $SiO_2$ is formed on both sides of the gate electrode {refer to FIG. 3(C)}.

Subsequently, by implanting a dopant such as arsenic ions $As^+$, phosphorus ions $P_+$, or so forth, in high concentration, into the surface of the silicon substrate 30 in the direction vertical to the surface thereof, self-aligning ion implantation by the agency of the gate electrode provided with the sidewalls 46 is performed {refer to FIG. 3(D)}.

At this point in time, as the regions directly beneath the gate electrode are blocked by the respective sidewalls 46, and consequently, the ions can not be implanted thereinto, so that these regions remain in shallow junction state (that is, remaining as LDD regions) while the dopant in high concentration is implanted into other regions, which are rendered in deep junction state. Accordingly, a source region 40 and a drain region 42, having the LDD region in the respective regions directly beneath the gate electrode, are formed.

However, with the conventional method as described above, there will arise a problem that since the $SiO_2$ film 44 is etched back when forming the sidewall 46 on both sides of the gate electrode, such etch-backing causes the gate oxide film 34 to be damaged, thereby deteriorating the performance of a MOSFET.

Further, there will arise another problem that since the sidewalls themselves contain a number of defects and the like, hot carriers are injected into the sidewalls when the MOSFET is in operation, thereby deteriorating the performance of the MOSFET.

To cope with the problems described above, the invention has been developed, and it is an object of the invention to provide a method of fabricating a MOSFET whereby a source region and a drain region, having a LDD region in respective regions of a silicon substrate, directly beneath the gate electrode, can be formed even without forming sidewalls.

SUMMARY OF THE INVENTION

In order to achieve the objects described above, a method of fabricating a field effect transistor, according to a first aspect of the invention, comprises a gate electrode forming step of forming a gate electrode layer by patterning a polysilicon layer formed on a gate oxide film provided on the surface of a substrate, and forming a gate electrode through selective growth of a silicide on the surface of the gate electrode layer, a first doping step of implanting ions into the upper surface of the substrate from a direction at a slant to the upper surface thereof such that a dopant in low concentration is introduced into regions directly beneath the edges of the gate electrode, and a second doping step of implanting ions into the upper surface of the substrate from the direction vertical to the upper surface of the substrate such that a dopant in high concentration is introduced.

That is, with the gate electrode forming step according to the first aspect of the invention, selective growth of the silicide is caused to take place on the surface of the gate electrode layer, and consequently, a silicide layer is formed on the side faces of the gate electrode as well. In the course of the first doping step, since ions are implanted into the upper surface of the substrate from a direction at a slant to the upper surface thereof such that a dopant in low concentration is introduced into regions directly beneath the edges of the gate electrode, a source region and a drain region, in desirably shallow junction state, can be formed in the regions directly beneath the edges of the gate electrode as well.

In the course of the second doping step, since ions are implanted into the upper surface of the substrate from the direction vertical to the upper surface thereof, the silicide layer formed on the side faces of the gate electrode covers up the regions directly beneath the edges of the gate electrode, thereby preventing ions from being implanted therein with ease. Accordingly, the regions directly beneath the edges of the gate electrode wherein ions are prevented from being implanted will remain in shallow junction state (that is, remaining as LDD regions) while other regions wherein a dopant in high concentration is implanted will be in deep junction state. Thus, the source region and the drain region, having the LDD region, respectively, can be formed in the regions directly beneath the edges of the gate electrode.

With these features, the dopant used for the implantation of ions may include, for example, at least either of arsenic and phosphorus in the case of an N-channel MOSFET, and may include, for example, at least either of boron and boron fluoride in the case of a P-channel MOSFET.

DETAILED DESCRIPTION OF THE PREFERRED EMBODIMENTS

First Embodiment

Figure 1A:
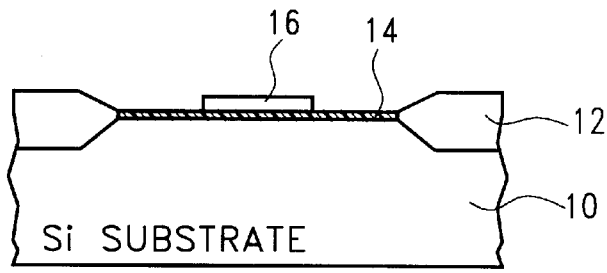
FIGS. 1A–1C is a flow sheet broadly illustrating steps of a first embodiment of a method of fabricating a MOSFET according to the invention.
Figure 1B:
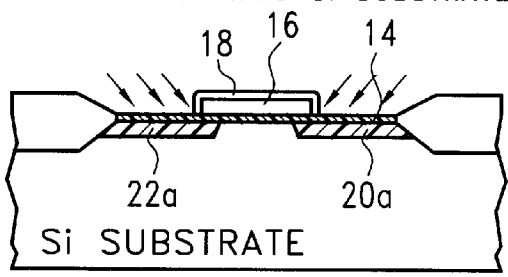

A first embodiment of a method of fabricating a MOSFET according to the invention is described with reference to FIG. 1.

First, device separation regions 12 are formed to thickness of 600 nm on a silicon substrate 10 provided with a well formed therein by the known techniques such that a dopant is in concentration in the order of, for example, $1 \times 10^{17}$ cm$^{-3}$.

Subsequently, the silicon substrate 10 is left inside an oxidizing furnace with temperature regulated at 800° C., thereby forming a SiO$^2$ film, about 4 nm thick., which is to serve as a gate oxide film 14, in regions which are not covered by the device separation regions 12, and in which the surface of the silicon substrate 10 is exposed.

Thereafter, a resist pattern (not shown) serving as a mask for patterning the gate electrode is formed after forming a polysilicon film (not shown) which is an electrically conductive film to thickness of 200 nm by the LPCVD method. By etching unnecessary portions of the polysilicon film using the resist pattern as a mask, a polysilicon layer 16 is formed {refer to FIG. 1(A)}.

Further, by the thermal CVD method, a metal having a high melting point, for example, Mo, W, Ti, or so forth, is formed on the entire surface. Subsequently, by applying a heat treatment thereto, and causing the metal having a high melting point to react with the polysilicon layer 16, a silicide layer 18 is formed on the surface of the polysilicon layer 16. At this point in time, there remain portions of the metal having a high melting point, which have not undergone reaction, on top of the gate oxide film 14 and the device separation regions 12. Subsequently, wet etching is applied thereto. By such wet etching, the portions of the metal having a high melting point, which have not undergone reaction, are removed, thereby forming the gate electrode comprising a double layer of the polysilicon layer 16 and the silicide layer 18. Thereafter, a first implantation of ions in low concentration is performed by implanting arsenic ions As$^+$ or phosphorus ions P$^+$, in low concentration, into the surface of the silicon substrate 10 from a direction at a slant to the surface thereof such that a dopant is implanted into respective regions directly beneath the edges of the polysilicon layer 16, within a region set to form a source and a drain, respectively, on respective sides of the gate electrode {refer to FIG. 1(B)}. As a result, a source region 20a and a drain region 22a, which are in shallow junction state, are formed.

In the case where there is a need for controlling a short channel effect, boron ions B$^+$ are preferably implanted in a direction at slant to the surface of the silicon substrate 10 at an acceleration voltage of 45 KeV so as to be in the order of $4 \times 10^{12}$ cm$^2$ in concentration, for example, after the first implantation of ions in low concentration. Further, in the case where there is a need for controlling a threshold voltage VT, boron fluoride ions BF$_2{}^+$ are preferably implanted in a direction at slant to the surface of the silicon substrate 10 at an acceleration voltage of 90 KeV so as to be in the order of $4 \times 10^{12}$ cm in concentration, for example, after the first implantation of ions in low concentration.

Figure 1C:
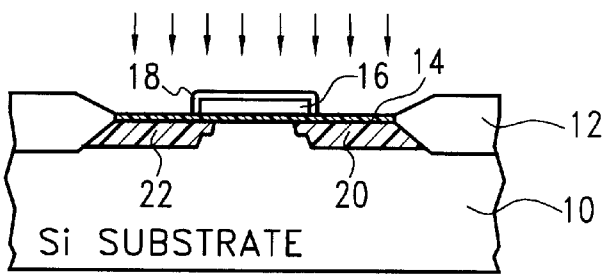

Subsequently, a second implantation of ions in high concentration is performed by implanting arsenic ions As$^+$, in high concentration, into the source region 20a and the drain region 22a, in shallow junction state, formed on respective sides of the gate electrode, from the direction vertical to the surface of the silicon substrate 10 {refer to FIG. 1(C)}. At this point in time, the silicide layer 18 covering side faces of the polysilicon layer 16 is present on top of regions directly beneath the edges of the polysilicon layer 16, and the ions are prevented from being implanted thereinto, so that in the regions directly beneath the edges of the polysilicon layer 16, that is, regions directly beneath the gate electrode, a LDD region is formed, and remains as it is, while a dopant in high concentration is implanted into other regions of the silicon substrate 10, which are rendered into deep junction state. Accordingly, a source region 20 and a drain region 22, having the LDD region in the respective regions directly beneath the gate electrode, are obtained.

Thus, with the first embodiment of the invention, the source region 20 and the drain region 22 of an N-channel MOSFET can be formed without forming the sidewalls, so that a process of fabricating the MOSFET can be simplified. In addition, since there is no need of forming the sidewalls, there will not arise problems such that the gate oxide film is damaged due to the effect of the etching applied when making the sidewalls, the performance of the MOSFET is deteriorated due to defects residing in the sidewalls themselves, and so forth.

Second Embodiment

Figure 2A:
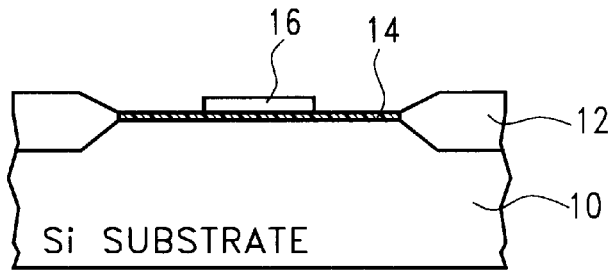
FIGS. 2A–2C a flow sheet broadly illustrating steps of a second embodiment of a method of fabricating a MOSFET according to the invention.
Figure 2B:
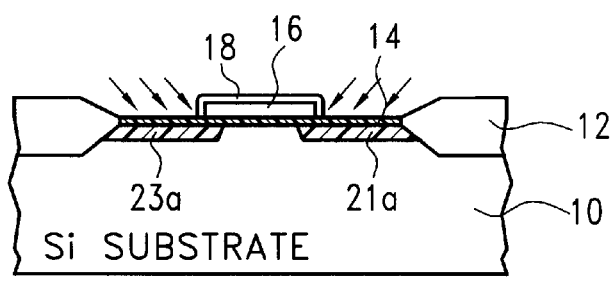

A second embodiment of a method of fabricating a MOSFET according to the invention is described with reference to FIG. 2.

First, device separation regions 12 are formed to thickness of 600 nm on a silicon substrate 10 provided with a well formed therein by the known techniques such that a dopant is in concentration in the order of, for example, $1 \times 10^{17}$ cm$^{-3}$. Subsequently, the silicon substrate 10 is left inside an oxidizing furnace with temperature regulated at 800° C., thereby forming a SiO$^2$ film, about 4 nm thick., which is to serve as a gate oxide film 14, in regions which are not covered by the device separation regions 12, and in which the surface of the silicon substrate 10 is exposed.

Thereafter, a resist pattern (not shown) serving as a mask for patterning the gate electrode is formed after forming a polysilicon film (not shown) which is an electrically conductive film to thickness of 200 nm by the LPCVD method. By etching unnecessary portions of the polysilicon film using the resist pattern as a mask, a polysilicon layer 16 is formed {refer to FIG. 2(A)}.

Further, through selective growth of material used for a gate silicide, for example, MoSi$_2$, WSi$_2$, TiSi$_2$, and so forth, occurring on the surface of the polysilicon layer 16 by use of the thermal CVD method, a silicide layer 18 is formed, thereby forming a gate electrode made up of two layers, that is, the polysilicon layer 16 and the silicide layer 18. Thereafter, a first implantation of ions in low concentration is performed by implanting boron ions B$^+$ or boron fluoride ions BF2$^+$, in low concentration, into the surface of the silicon substrate 10 from a direction at a slant to the surface thereof such that a dopant is implanted into respective regions directly beneath the edges of the gate electrode, within a region set to form a source and a drain, respectively, on respective sides of the gate electrode {refer to FIG. 2(B)}. As a result, a source region 21a and a drain region 23a, which are in shallow junction state, are formed.

In the case where there is a need for controlling a short channel effect, arsenic ions As$^+$ or phosphorus ions P$^+$ are implanted in a direction at slant to the surface of the silicon substrate 10.

Figure 2C:
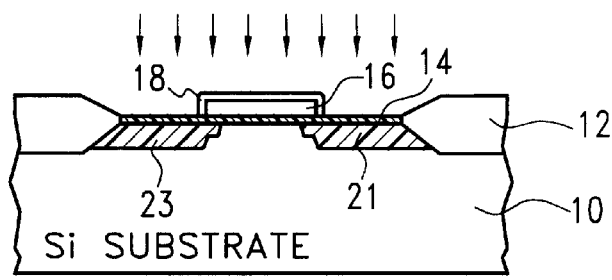
Figure 3A:
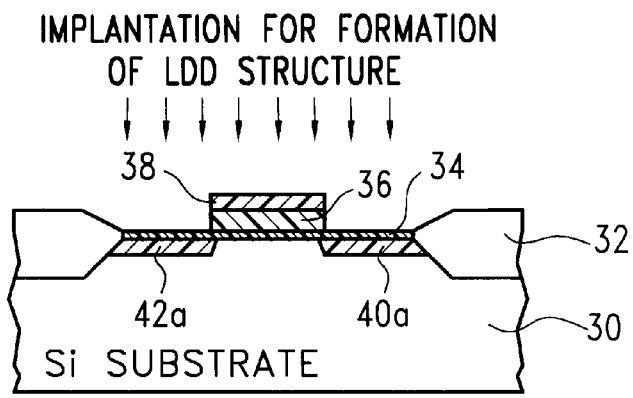
FIGS. 3A–3D is a flow sheet broadly illustrating steps of a conventional method of fabricating a MOSFET.
Figure 3B:
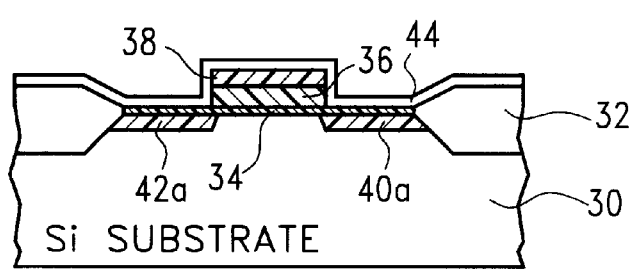
Figure 3C:
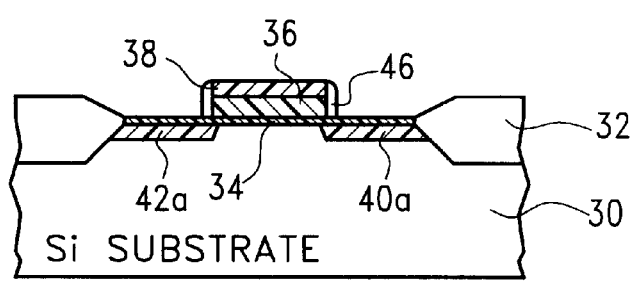
Figure 3D:
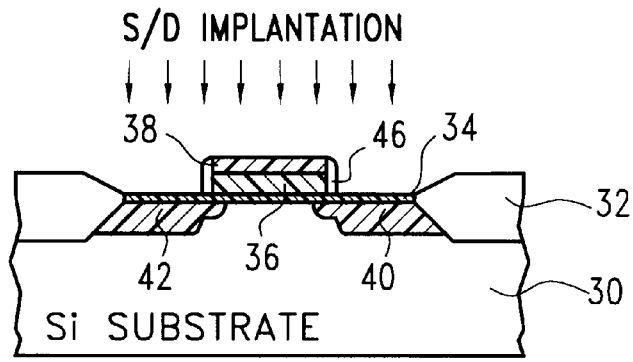

Subsequently, a second implantation of ions in high concentration is performed by implanting boron ions B+, in high concentration, into a region set to form a source and a drain, respectively, formed on respective sides of the gate electrode, from the direction vertical to the surface of the silicon substrate 10 {refer to FIG. 2(C)}. At this point in time, the silicide layer 18 covering side faces of the polysilicon layer 16 is present on top of regions directly beneath the edges of the polysilicon layer 16, and the ions are prevented from being implanted thereinto, so that in the regions directly beneath the edges of the polysilicon layer 16, that is, regions directly beneath the gate electrode, a LDD region is formed, and remains as it is, while a dopant in high concentration is implanted into other regions of the silicon substrate 10, which are rendered into deep junction state. Accordingly, a source region 21 and a drain region 23, in shallow junction state, having the LDD region in the respective regions directly beneath the gate electrode, are obtained.

Thus, with the second embodiment of the invention, the source region 21 and the drain region 23 of a P-channel MOSFET can be formed without forming the sidewalls, so that a process of fabricating the MOSFET can be simplified.

In addition, since there is no need of forming the sidewalls, there will not arise problems such that the gate oxide film is damaged due to the effect of the etching applied when making the sidewalls, or the performance of the MOSFET is deteriorated due to defects residing in the sidewalls themselves, and so forth.

As described hereinbefore, the method of fabricating a field effect transistor according to the invention has an advantageous effect in that there is no need of forming the sidewalls, enabling a fabrication process to be simplified, and the cost of fabrication to be held back.

Furthermore, the method has another advantageous effect in that since the sidewalls are not formed, it is possible to eliminate an adverse effect resulting from a step of forming the sidewalls and an adverse effect attributable to the sidewalls themselves, and a MOSFET exactly as designed can be obtained without causing degradation in the characteristics of the MOSFET.

What is claimed is:

1. A method of fabricating a field effect transistor, the method comprising:

forming a polysilicon layer patterned on a gate oxide film formed on the surface of a substrate;

forming a metal layer having a high melting point in such a way as to extend from over the polysilicon layer to over the gate oxide film;

forming a silicide layer by causing the metal layer having a high melting point to react with the polysilicon layer, and forming a gate electrode made up of the silicide layer and the polysilicon layer;

removing portions of the metal layer having a high melting point, which have not undergone reaction with the polysilicon layer; and implanting ions into the surface of the substrate to form source and drain electrodes having lightly-doped regions directly beneath the edges of the gate electrode, and more heavily-doped regions adjacent to the lightly-doped regions, without the use of sidewall spacers to mask the lightly-doped regions, the implantation of ions in the lightly doped regions and the implantation of ions in the more heavily-doped regions being performed consecutively.

2. A method of fabricating a field effect transistor according to claim 1, wherein the silicide layer is formed by means of a heat treatment.

3. A method of fabricating a field effect transistor according to claim 1, wherein the portions of the metal layer having a high melting point, which have not undergone reaction with the polysilicon layer, are removed by wet etching.

4. A method of fabricating a field effect transistor, the method comprising:

forming a polysilicon layer patterned on a gate oxide film formed on the surface of a substrate;

forming a metal layer having a high melting point in such a way as to extend over the polysilicon layer to over the gate oxide film;

forming a silicide layer by causing the metal layer having a high melting point to react with the polysilicon layer, and forming a gate electrode made up of the silicide layer and the polysilicon layer;

removing portions of the metal layer having a high melting point, which have not undergone reaction with the polysilicon layer;

implanting ions into the surface of the substrate such that a first conduction type dopant in a first concentration is introduced into regions directly beneath the edges of the gate electrode; and implanting ions into the surface of the substrate such that the first conduction type dopant in a second concentration higher than the first concentration is introduced thereinto, without the use of sidewall spacers to mask the regions directly beneath the edges of the gate electrode, the implantation of ions in the first concentration and the implantation of ions in the second concentration being performed consecutively.

5. A method of fabricating a field effect transistor according to claim 4, wherein the suicide layer is formed by means of a heat treatment.

6. A method of fabricating a field effect transistor according to claim 4, wherein the portions of the metal layer having a high melting point, which have not undergone reaction with the polysilicon layer, are removed by wet etching.

7. A method of fabricating a field effect transistor according to claim 4, wherein the first conduction type dopant includes arsenic or phosphorus.

8. A method of fabricating a field effect transistor according to claim 4, wherein the first conduction type dopant includes boron or boron fluoride.

9. A method of fabricating a field effect transistor, the method comprising:

forming a polysilicon layer patterned on a gate oxide film formed on the surface of a substrate;

forming a metal layer having a high melting point in such a way as to extend over the polysilicon layer to over the gate oxide film;

forming a silicide layer by causing the metal layer having a high melting point to react with the polysilicon layer, and forming a gate electrode made up of the silicide layer and the polysilicon layer;

removing portions of the metal layer having a high melting point, which have not undergone reaction with the polysilicon layer;

implanting ions into the surface of the substrate from a direction at a slant to the surface thereof such that a first conduction type dopant in a first concentration is introduced into regions directly beneath the edges of the gate electrode; and implanting ions into the surface of the substrate from the direction vertical to surface thereof such that the first conduction type dopant in a second concentration higher than the first concentration is introduced thereinto, without the use of sidewall spacers to mask the regions directly beneath the edges of the gate electrode, the implantation of ions in the first concentration and the implantation of ions in the second concentration being performed consecutively.

10. A method of fabricating a field effect transistor according to claim 9, wherein the silicide layer is formed by means of a heat treatment.

11. A method of fabricating a field effect transistor according to claim 9, wherein the portions of the metal layer having a high melting point, which have not undergone reaction with the polysilicon layer, are removed by wet etching.

12. A method of fabricating a field effect transistor according to claim 9, wherein the first conduction type dopant includes arsenic or phosphorus.

13. A method of fabricating a field effect transistor according to claim 9, wherein the first conduction type dopant includes boron or boron fluoride.

* * * * *